(12) United States Patent
Wang et al.

(10) Patent No.: US 12,015,413 B2
(45) Date of Patent: Jun. 18, 2024

(54) CODING FOR PULSE AMPLITUDE MODULATION WITH AN ODD NUMBER OF OUTPUT LEVELS

(71) Applicant: Apple Inc., Cupertino, CA (US)

(72) Inventors: Charles L. Wang, Los Altos, CA (US); Yi-Hsiu E. Chen, San Jose, CA (US); Pranavi Sunkara, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/945,429

(22) Filed: Sep. 15, 2022

(65) Prior Publication Data

US 2024/0097667 A1 Mar. 21, 2024

(51) Int. Cl.
*H03K 9/02* (2006.01)
*H03K 7/02* (2006.01)

(52) U.S. Cl.
CPC ............. *H03K 9/02* (2013.01); *H03K 7/02* (2013.01)

(58) Field of Classification Search
CPC .................................. H03K 9/02; H03K 7/02
See application file for complete search history.

(56) References Cited

U.S. PATENT DOCUMENTS

| | | |
|---|---|---|
| 9,853,642 B1 | 12/2017 | Tan et al. |
| 10,328,276 B2 | 6/2019 | Williams et al. |
| 10,404,505 B1 | 9/2019 | Wilson |
| 10,469,070 B1 | 11/2019 | Liu et al. |
| 10,491,436 B1 | 11/2019 | Lim et al. |
| 11,109,458 B2 | 8/2021 | Williams et al. |
| 2005/0089126 A1 | 4/2005 | Zerbe et al. |
| 2019/0108864 A1* | 4/2019 | Hollis ............... G11C 7/1006 |
| 2019/0394071 A1* | 12/2019 | Farzan ............... H03H 7/38 |

(Continued)

FOREIGN PATENT DOCUMENTS

| | | |
|---|---|---|
| CN | 110187732 A | 8/2019 |
| KR | 20060120160 A | 11/2006 |
| WO | WO2002061984 A1 | 8/2002 |

OTHER PUBLICATIONS

International Search Report and Written Opinion directed to related International Application No. PCT/US2023/074177, dated Jan. 8, 2024; 7 pages.

*Primary Examiner* — Sung S Ahn
(74) *Attorney, Agent, or Firm* — Sterne, Kessler, Goldstein & Fox P.L.L.C.

(57) ABSTRACT

The present disclosure describes embodiments of driver circuit. The driver circuit includes a first impedance element electrically coupled to a first inverter circuit and a second impedance element electrically coupled to the first impedance element and a second inverter circuit. For a first encoding using the driver circuit, the first inverter circuit and the second inverter circuit are controlled such that a first current flows through the first and second impedance elements, the first current having a first value and a first direction. For a second encoding using the driver circuit, the first inverter circuit and the second inverter circuit are controlled such that a second current flows through the first and second impedance elements, the second current having a second value and a second direction. The first value is substantially the same as the second value and the first direction is opposite to the second direction.

20 Claims, 9 Drawing Sheets

(56) References Cited

U.S. PATENT DOCUMENTS

2022/0157217 A1\* 5/2022 Uemura .................. G09G 3/20
2023/0116891 A1\* 4/2023 Hollis ................ G11C 11/4093
365/222

\* cited by examiner

CODING FOR PULSE AMPLITUDE MODULATION WITH AN ODD NUMBER OF OUTPUT LEVELS

FIELD

This disclosure relates to driver circuits for Pulse Amplitude Modulation (PAM), and more particularly, to driver circuits for Pulse Amplitude Modulation (PAM) with an odd number of output levels.

BACKGROUND

Pulse Amplitude Modulation (PAM) is a modulation scheme where the information can be encoded as an amplitude of a series of signal pulses. PAM can be used in different communication schemes. For example, some Ethernet communication standards can use PAM as their modulation scheme. As one example, 100BASE-T4 Ethernet standard uses three-level PAM modulation (PAM-3). As another example, 1000BASE-T Gigabit Ethernet uses five-level PAM-5 modulation. PAM can also be used for communication schemes for local computer bus for attaching hardware devices in a computer. For example, PAM can be used in Peripheral Component Interconnect (PCI) Express (e.g., PCI Express 6.0), which is part of the PCI Local Bus standard.

In PAM signaling schemes, such as PAM-2 modulation (non-return to zero (NRZ)) or PAM-4 modulation with an even number of output levels, there are a symmetric number of output levels. For example, PAM-2 modulation can have output levels '−1' and '+1'. PAM-4 modulation can have output levels '−1', '−⅓', '+⅓' and '+1'. For PAM signaling schemes with an even number of output levels, the average resistor current in a complementary voltage mode driver circuit can be zero or about zero. Therefore, driver circuit reliability concerns due to electro-migration is relatively low.

However, for PAM signaling schemes with an odd number of output levels (such as PAM-3 modulation, PAM-5 modulation, or the like), there is an output level that is not balanced by a corresponding complementary level. For example, the PAM-3 modulation can have output levels '−1', '0', and '+1'. Since the output level '0' does not have an equal and opposite complementary level, the overall average current in the driver circuit (and/or a driver circuit components) is non-zero. Therefore, driver circuit reliability concerns due to electro-migration increase.

SUMMARY

Various embodiments of this disclosure relate to apparatuses and methods for introducing an additional encoding for PAM signaling schemes with an odd number of output levels. For example, various embodiments of a driver circuit are disclosed to introduce an alternative encoding for the '0' output level such that the output level is '0' differentially but is created by swapping two halves of the driver circuit so the average current is about zero, thus improving reliability.

Various embodiments of a driver circuit are disclosed. In some embodiments, the driver circuit includes a first circuit and a second circuit. The first circuit includes a first inverter circuit having a first input terminal, a first output terminal, and a first impedance element electrically coupled to the first output terminal. The first circuit further includes a second inverter circuit having a second input terminal, a second output terminal, and a second impedance element electrically coupled to the second output terminal and electrically coupled to the first impedance element at a first connection point. The second circuit includes a third inverter circuit having a third input terminal, a third output terminal, and a third impedance element electrically coupled to the third output terminal. The second circuit further includes a fourth inverter circuit having a fourth input terminal, a fourth output terminal, and a fourth impedance element electrically coupled to the fourth output terminal and electrically coupled to the third impedance element at a second connection point. A first input signal to the first input terminal, a second input signal to the second input terminal, a third input signal to the third input terminal, and a fourth input signal to the fourth input terminal are selected such that the first connection point has substantially the same voltage as the second connection point for encoding a value using the driver circuit.

In some embodiments, a device includes a first inverter circuit electrically coupled to a first impedance element and a second inverter circuit electrically coupled to a second impedance element, where the second impedance element is electrically coupled to the first impedance element. The device further includes a processor configured to control, based on a first encoding, the first inverter circuit and the second inverter circuit such that a first current flows through the first and second impedance elements, where the first current has a first value and a first direction. The processor is further configured to control, based on a second encoding, the first inverter circuit and the second inverter circuit such that a second current flows through the first and second impedance elements, where the second current has a second value and a second direction. The first value is substantially the same as the second value, and the first direction is opposite to the second direction.

In some embodiments, a method includes determining that a first output level is to be generated by a driver circuit configured to generate an odd number of output levels. The method further includes determining whether a first encoding or a second encoding is to be used for generating the first output level. An average current in the driver circuit generated by the first encoding and the second encoding is substantially zero. The method further includes controlling a plurality of input signals to generate the first output level based at least on the first encoding or the second encoding.

BRIEF DESCRIPTION OF THE DRAWINGS

Aspects of the present disclosure are best understood from the following detailed description when read with the accompanying figures.

Illustrative embodiments will now be described with reference to the accompanying drawings. In the drawings, like reference numerals generally indicate identical, functionally similar, and/or structurally similar elements.

DETAILED DESCRIPTION

Figure 1:
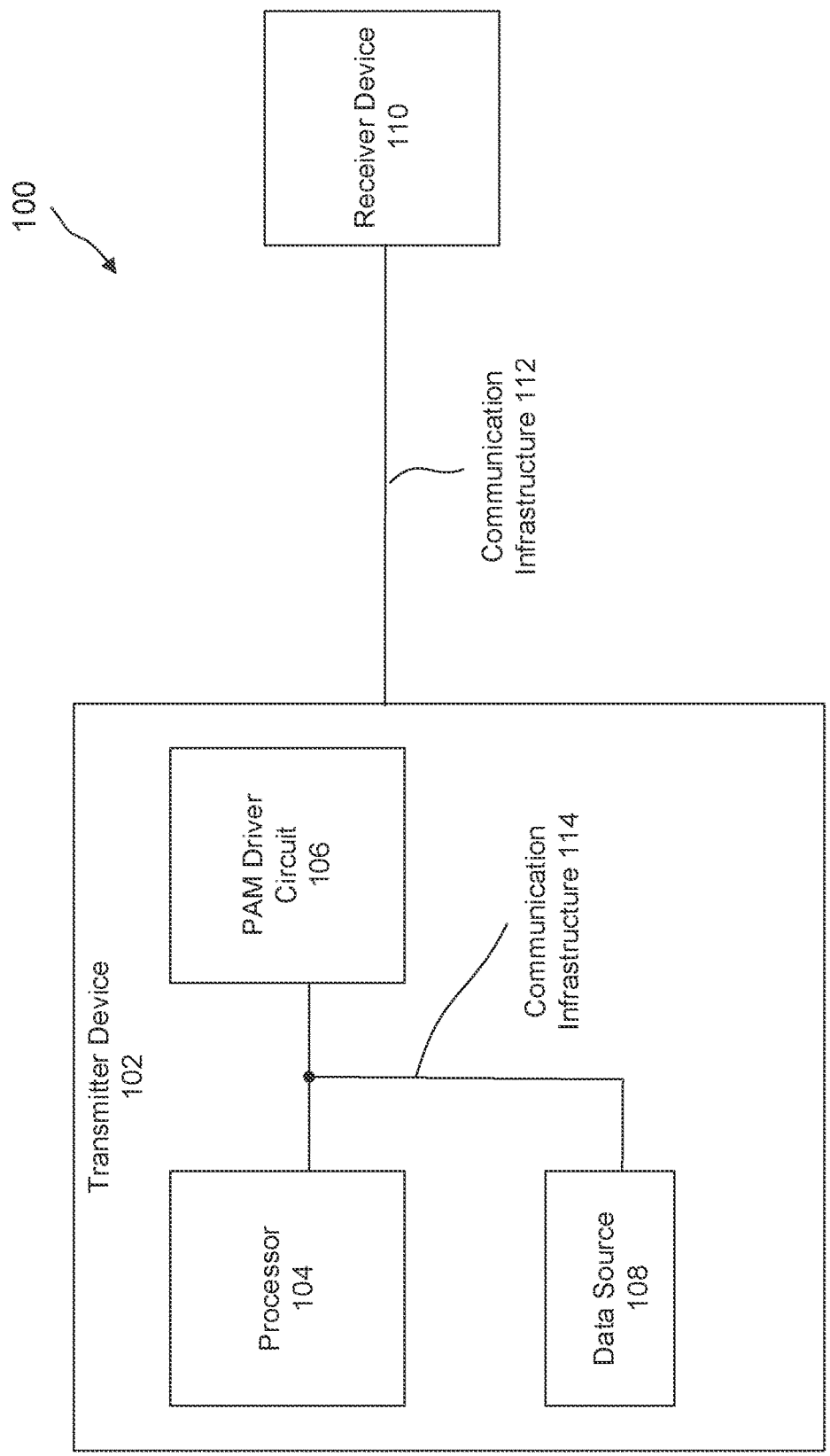
FIG. 1 illustrates a system that includes a PAM driver circuit, according to some embodiments.

The following disclosure provides many different embodiments, or examples, for implementing different features of the provided subject matter. Specific examples of components and arrangements are described below to simplify the present disclosure. These are merely examples and are not intended to be limiting. In addition, the present disclosure repeats reference numerals and/or letters in the various examples. This repetition is for the purpose of simplicity and clarity and, unless indicated otherwise, does not in itself dictate a relationship between the various embodiments and/or configurations discussed.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

In some embodiments, the terms "about" and "substantially" can indicate a value of a given quantity that varies within 20% of the value (e.g., ±1%, ±2%, ±3%, ±4%, ±5%, ±10%, ±20% of the value). These values are merely examples and are not intended to be limiting. The terms "about" and "substantially" can refer to a percentage of the values as interpreted by those skilled in relevant art(s) in light of the teachings herein.

It is to be understood that the phraseology or terminology herein is for the purpose of description and not of limitation, such that the terminology or phraseology of the present specification is to be interpreted by those skilled in relevant art(s) in light of the teachings herein.

FIG. 1 illustrates a system 100 that includes a PAM driver circuit 106, according to some embodiments. As shown in FIG. 1, system 100 can include a transmitter device 102 and a receiver device 110. Transmitter device 102 can communicate with receiver device 110 using communication infrastructure 112. Although transmitter device 102 is discussed herein as a transmitter device, the embodiments of this disclosure can include a transceiver device as transmitter device 102. Similarly, although receiver device 110 is discussed herein as a receiver device, the embodiments of this disclosure can include a transceiver device as receiver device 102.

According to some embodiments, transmitter device 102 and receiver device 110 can belong to different systems that communicate with each other using communication infrastructure 112. For example, transmitter device 102 can be located on a first computer system and receiver device 110 can be located on a second computer system, where the first and second computer systems communicate with each other using communication infrastructure 112 (e.g., an Ethernet cable). However, the embodiments of this disclosure are not limited to these examples and other systems can use transmitter device 102 and receiver device 110.

Additionally, or alternatively, transmitter device 102 and receiver device 110 can belong to the same system. For example, transmitter device 102 and receiver device 110 can be devices and/or circuits on the same computer system and can communicate with each other using communication infrastructure 112 (e.g., a PCI bus.) In some embodiments, the computer system that includes transmitter device 102 and receiver device 110 can be a system-on-chip (SoC). In some embodiments, the computer system that includes transmitter device 102 and receiver device 110 can be configured for use in a desktop computer, a server, or a mobile computing system, such as a tablet, a laptop computer, and a wearable computing device.

Communication infrastructure 112 provides communication between, for example, transmitter device 102 and receiver device 110. According to some embodiments, communication infrastructure 112 can use PAM as its modulation scheme. In some implementations, communication infrastructure 112 can use Ethernet communication standards that use PAM as their modulation scheme. As one example, 100BASE-T1 Ethernet standard, 100BASE-T1 Ethernet standard, and 1000BASE-T4 Ethernet standard use three-level PAM modulation (PAM-3). As another example, 10BASE-T Ethernet standard, 100BASE-T2 Ethernet standard, 1000BASE-T Ethernet standard use five-level PAM-5 modulation. PAM can also be used for communication schemes for a local computer bus attaching hardware devices in a computer system. In some implementations, communication infrastructure 112 can use PCI (e.g., PCI Express, such as PCI Express 6.0), a high speed standard part of the PCI Local Bus standard. In some implementations, communication infrastructure 112 can be display ports. In some implementations, communication infrastructure 112 can be a Universal Serial Bus (USB). In some implementations, communication infrastructure 112 can be used within microcontrollers for communicating control signals. In some implementations, communication infrastructure 112 can be used in photobiology. However, the embodiments of this disclosure are not limited to these examples, and communication infrastructure 112 can include other communication infrastructures that can use PAM signaling schemes as a modulation scheme. In some examples, communication infrastructure 112 can include a printed circuit board (PCB), a FR4 PCB, a wire cable, a coaxial cable, an AC-coupled communication infrastructure or DC-coupled communication infrastructure, an optical communication infrastructure, or the like.

Transmitter device 102 can include a processor 104, a PAM driver circuit 106 (also referred to herein as "driver circuit 106"), a data source 108, and a communication infrastructure 114. According to some embodiments, data source 108 can include the data (e.g., the output transmit pattern) that transmitter device 102 is to send to receiver device 110. In some embodiments, data source 108 can belong to and/or be located at the higher levels (e.g., higher levels in the Open Systems Interconnect (OSI) model) of transmitter device 102. Additionally, or alternatively, data source 108 can include a memory circuit for storing the data (e.g., the output transmit pattern) that transmitter device 102 is to send to receiver device 110. The memory circuit can include any suitable type of memory, such as a dynamic random-access memory (DRAM), a static random-access memory (SRAM), a read-only memory (ROM), an electrically erasable programmable read-only memory (EE- PROM), or a non-volatile memory. It is noted that although a single data source 108 is illustrated in FIG. 1, any suitable number of data sources may be employed.

In some embodiments, processor 104 can be representative of a general-purpose processor that performs computational operations. For example, processor 104 can be a central processing unit (CPU), such as a microprocessor, a graphics processing unit (GPU), a microcontroller, an application-specific integrated circuit (ASIC), or a field-programmable gate array (FPGA). It is noted that although a single processor 104 is illustrated in FIG. 1, any suitable number of processors may be employed.

Communication infrastructure 114 can provide the communication between processor 104, PAM driver circuit 106, and data source 108. In some examples, communication infrastructure 114 can include a communication bus. In some examples, communication infrastructure 114 can include any communication infrastructure such as, but not limited to, a PCB, a FR4 PCB, a wire cable, a coaxial cable, an AC-coupled communication infrastructure or DC-coupled communication infrastructure, an optical communication infrastructure, or the like.

According to some embodiments, PAM driver circuit 106 is configured to receive the data (e.g., the output transmit pattern) that transmitter device 102 is to send to receiver device 110 and modulate the received data to send to receiver device 110 on communication infrastructure 112. PAM driver circuit 106 can use different PAM signaling schemes such as, but not limited to, PAM-2 modulation, PAM-3 modulation, PAM-4 modulation, PAM-5 modulation, or the like. According to some embodiments, PAM driver circuit 106 can receive the data from data source 108 and/or processor 104. In some examples, processor 104 can control the operations of PAM driver circuit 106 and/or control the data from data source 108 to PAM driver circuit 106. According to some embodiments, PAM driver circuit 106 is configured to receive the data (e.g., the output transmit pattern) from, for example, data source 108 and generate output levels based on the received data and/or some control information from processor 104. PAM driver circuit 106 is configured to transmit the generated output levels on communication infrastructure 112 to receiver device 110. According to some embodiments, the output levels are the signal amplitudes of the output signals of PAM driver circuit 106.

It is noted that although a single PAM driver circuit 106 is illustrated in FIG. 1, any suitable number of driver circuits may be employed. Also, although processor 104, PAM driver circuit 106, and data source 108 are illustrated as separate devices/circuits in FIG. 1, the embodiments of this disclosure can include any combination of processor 104, PAM driver circuit 106, and data source 108.

Some examples are discussed herein with respect to PAM-3 modulation. However, the embodiments of this disclosure can be applied to any suitable PAM signaling schemes with, for example, an odd number of output levels. As discussed above, the PAM-3 modulation can have output levels '−1', '0', and '+1'. In a non-limiting example where PAM driver circuit 106 uses PAM-3 modulation, PAM driver circuit 106 and/or processor 104 can use two threshold levels for determining the output levels from the data received at PAM driver circuit 106 and/or at processor 104. For example, PAM driver circuit 106 and/or processor 104 use a first threshold level and a second threshold level, where the second threshold level is smaller than the first threshold level.

PAM driver circuit 106 and/or processor 104 can compare the data (e.g., the output transmit pattern) from, for example, data source 108 with the threshold levels. If the data is greater than the first threshold level, PAM driver circuit 106 can generate '+1' output level. If the data is smaller than that second threshold lever, PAM driver circuit 106 can generate '−1' output level. If the data is between the first and second threshold levels, PAM driver circuit 106 can generate '0' output level. In some examples, the threshold levels can be a ternary signal or a ternary symbol.

In a non-limiting example in 100Base-T1, two ternary symbols can be combined to form a code group. When code group represents data, it represents three bits of data:

TABLE 1

| | two ternary symbols | |
|---|---|---|
| Data | T1 | T2 |
| 000 | −1 | −1 |
| 001 | −1 | 0 |
| 010 | −1 | 1 |
| 011 | 0 | −1 |
| Used for solid-state drive (SSD)/Electrostatic Discharge (ESD) | 0 | 0 |
| 100 | 0 | 1 |
| 101 | 1 | −1 |
| 110 | 1 | 0 |
| 111 | 1 | 1 |

As illustrated in Table 1, data can be the data input to PAM driver circuit 106 and T1 and T2 are the output levels (e.g., symbols) that are the output of PAM driver circuit 106.

As noted above, the embodiments of this disclosure are not limited to these examples and can include any suitable PAM signaling schemes with, for example, an odd number of output levels.

As discussed in more detail below, various embodiments of this disclosure relate to circuits and methods for introducing an additional encoding for the PAM signaling schemes with an odd number of output levels. For example, various embodiments of PAM driver circuit 106 are disclosed to introduce an alternative encoding for, for example, the '0' output level such that the output level is '0' differential but is created by swapping the two halves of the driver circuit such that the current can be averaged to be zero (or about zero) and better reliability can be achieved.

According to some embodiments, PAM driver circuit 106 can be a voltage mode driver circuit. However, the embodiments of this disclosure can also be applied to other driver types such as current mode logic circuit and benefits can be achieved by spreading the average current across different components of the driver circuit.

According to some embodiments, processor 104 can be configured to enable or disable the '+0' and '−0' encodings. In some examples, transmitter device 102 can be configured to enable or disable the '+0' and '−0' encodings by sending a request to processor 104. Additionally, or alternatively, processor 104 can be configured to enable or disable the '+0' and '−0' encodings based on one or more parameters such as, but not limited to, operating conditions of transmitter device 102, processor 104, and/or PAM driver circuit 106.

Figure 2:
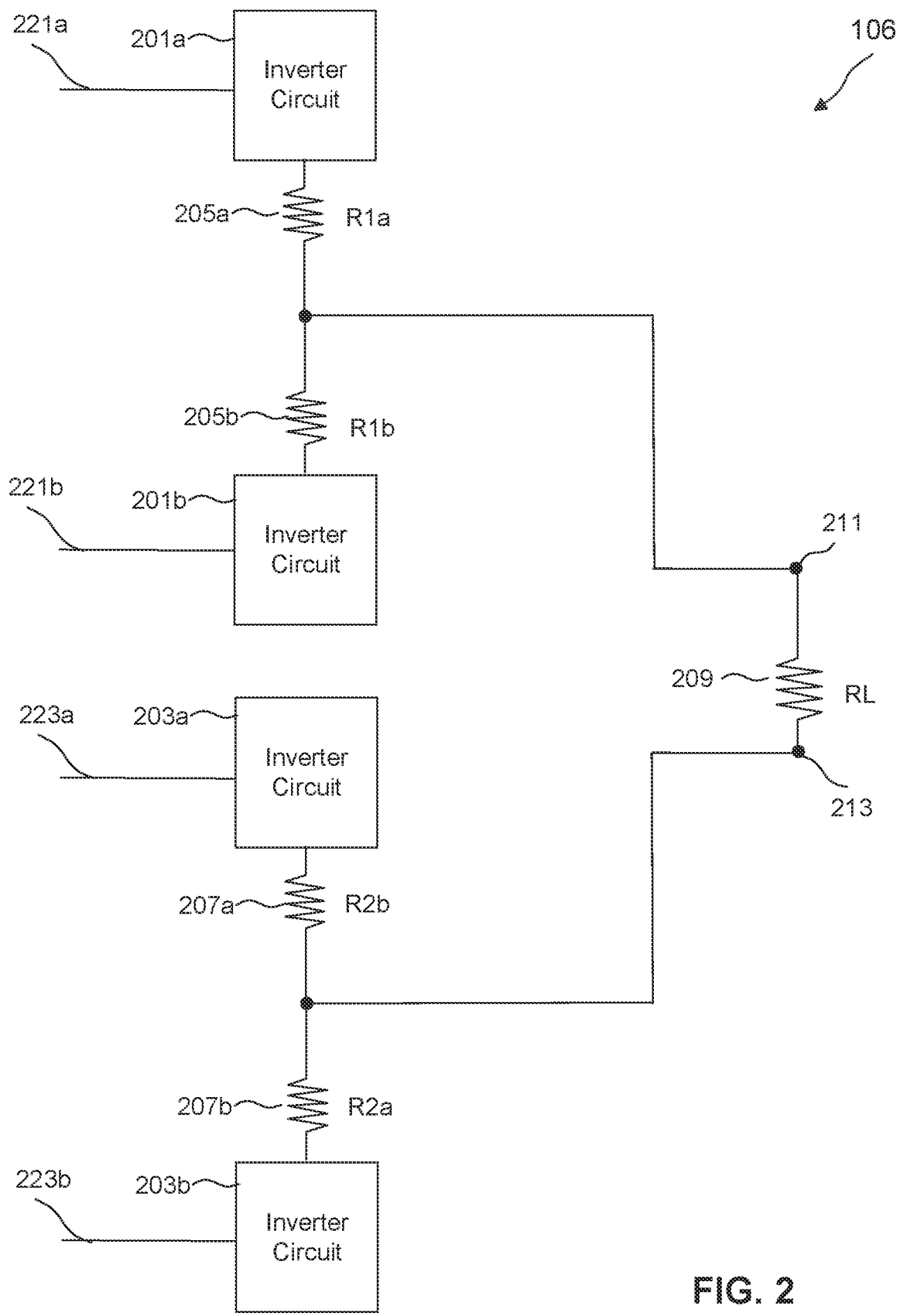
FIG. 2 illustrates a PAM driver circuit, according to some embodiments.

FIG. 2 illustrates an implementation of PAM driver circuit 106, according to some embodiments. As illustrated in FIG. 2, PAM driver circuit 106 can include inverter circuits 201a, 201b, 203a, 203a, impedance elements 205a, 205b, 207a, 207b, and load 209. PAM driver circuit 106 can include two halves. The first half of PAM driver circuit 106 can include inverter circuits 201a and 201b and impedance elements 205a and 205b. The second half of PAM driver circuit 106 can include inverter circuits 203a and 203b and impedance elements 207a and 207b.

Some embodiments of this disclosure are discussed with respect to resistors as examples of impedance elements 205a, 205b, 207a, 207b (e.g., resistors 205a, 205b, 207a, 207b.) However, the embodiments of this disclosure are not limited to resistors, and impedance elements 205a, 205b, 207a, 207b can include other elements such as, but not limited to, inductors, coils, T-coils, or the like. In some implementations, PAM driver circuit 106 can include a differential resistance, in addition to impedance elements 205a, 205b, 207a, 207b.

As illustrated in FIG. 2, inverter circuit 201a is electrically coupled to resistor 205a and can be controlled using input signal 221a. Resistor 205a is also electrically coupled to resistor 205b. Resistor 205b is further electrically coupled to inverter circuit 201b. Inverter circuit 201b can be controlled using input signal 221b.

Similarly, as illustrated in FIG. 2, inverter circuit 203a is electrically coupled to resistor 207a and can be controlled using input signal 223a. Resistor 207a is also electrically coupled to resistor 207b. Resistor 207b is further electrically coupled to inverter circuit 203b. Inverter circuit 203b can be controlled using input signal 223b.

Load 209 is electrically coupled between output ports 211 and 213. In some implementations, load 209 can be a resistor. However, the embodiments of this disclosure are not limited to this example, and load 209 can include other loads. In some examples, load 209 can be a differential load. In some examples, load 209 can be single-ended electrically coupled to a supply or reference voltage. Output port 211 is a connection point, where resistor 205a is electrically coupled to resistor 205b. Output port 213 is a connection point, where resistor 207a is electrically coupled to resistor 207b. According to some embodiments, the output levels generated by PAM driver circuit 106 are the signal amplitudes of the output signals of PAM driver circuit 106, for example, the voltage levels at load 209. In other words, the output levels generated by PAM driver circuit 106 are the voltage differences between the voltage levels at output port 211 and the voltage levels at output port 213.

According to some embodiments, input signals 221a, 221b, 223a, 223b are used to control PAM driver circuit 106 to generate the output levels based on the data (e.g., the output transmit pattern) from, for example, data source 108 of FIG. 1. The data can be randomized data by coding, by scrambling, or any other suitable method. In some implementations, processor 104 can receive the data from data source 108 and use the data to generate input signals 221a, 221b, 223a, 223b based on the data. Processor 104 can send input signals 221a, 221b, 223a, 223b to PAM driver circuit 106 to generate the output levels based on the data. Additionally, or alternatively, PAM driver circuit 106 can receive the data from data source 108 and generate input signals 221a, 221b, 223a, 223b based on the data. PAM driver circuit 106 can use input signals 221a, 221b, 223a, 223b to generate the output levels.

According to some embodiments, PAM driver circuit 106 is configured to generate a '+1' output level, a '−1' output level, and two '0' output levels. The two '0' output levels are described herein as a '+0' output level and a '−0' output level. By generating alternative '0' output levels, PAM driver circuit 106 is configured to generate the output level that is '0' differential but is created by swapping the two halves of PAM driver circuit 106 such that current can be averaged to be zero or about zero. Therefore, better reliability can be achieved and electro-migration can be reduced.

Figure 4A:
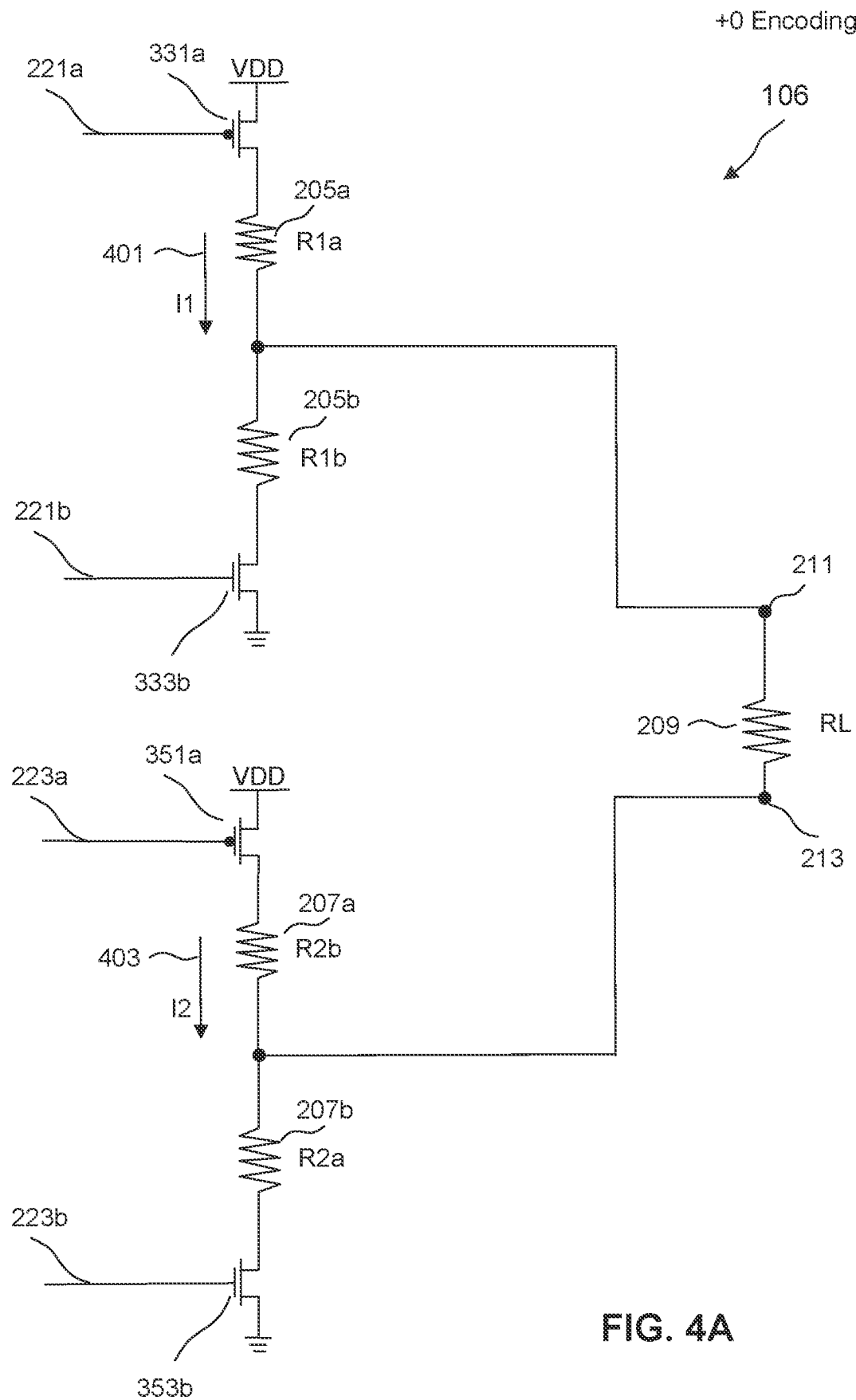
FIG. 4A illustrates the PAM driver circuit operating for the '+0' encoding, according to some embodiments.

As discussed in more detail with respect to FIG. 4A, for a first encoding of PAM driver circuit 106 (e.g., '+0' encoding) to generate the '+0' output level, input signals 221a, 221b, 223a, 223b can be controlled such that a first current can flow through resistors 205a and 205b. The first current has a first value and a first direction. According to some embodiments, input signals 221a, 221b, 223a, 223b can be controlled/generated by processor 104 and/or PAM driver circuit 106 based on the data from data source 108 to generate the first current.

Figure 4B:
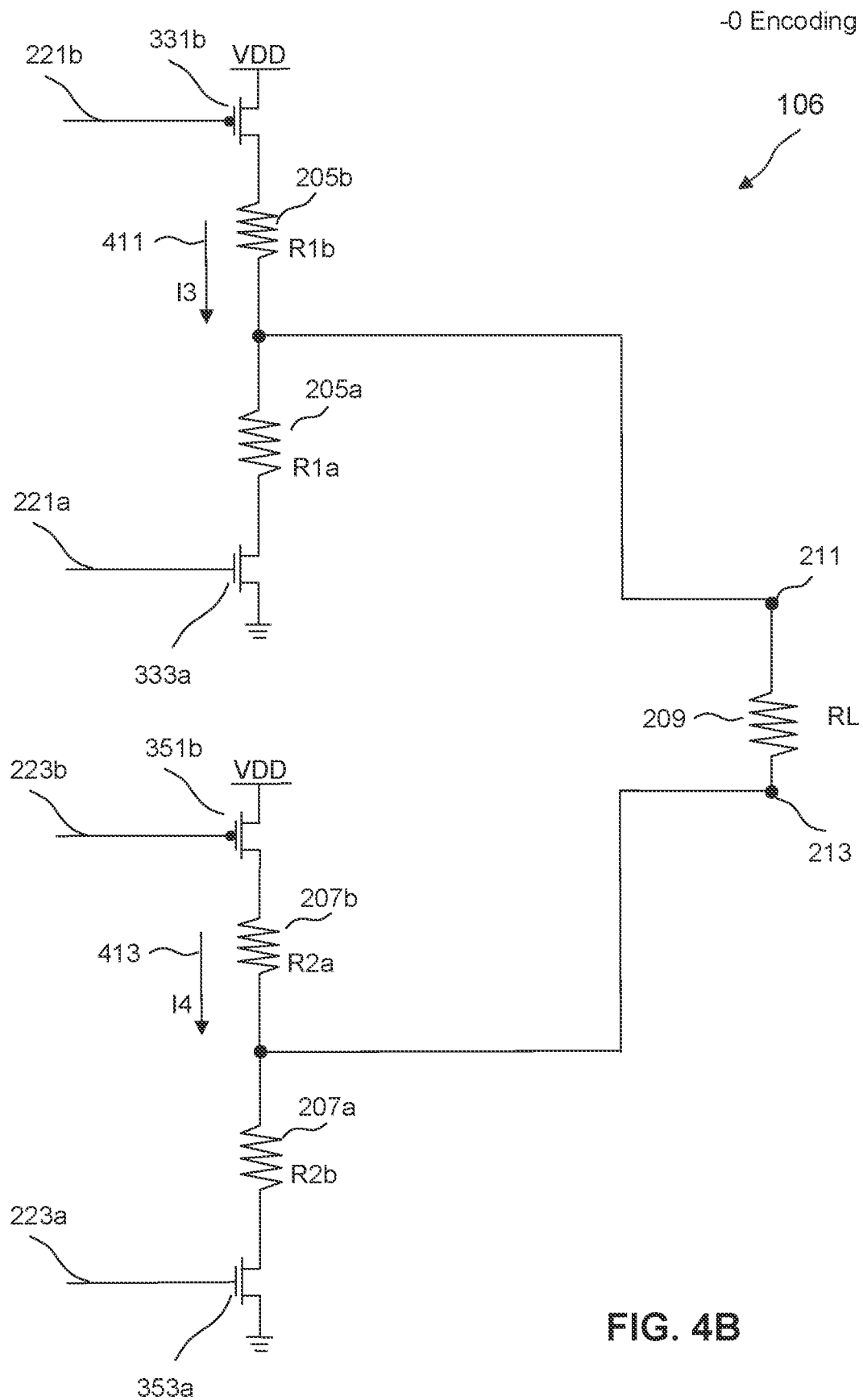
FIG. 4B illustrates the PAM driver circuit operating for the '−0' encoding, according to some embodiments.

As discussed in more detail with respect to FIG. 4B, for a second encoding of PAM driver circuit 106 (e.g., '−0' encoding) to generate the '−0' output level, input signals 221a, 221b, 223a, 223b can be controlled such that a second current can flow through resistors 205a and 205b. The second current has a second value and a second direction. According to some embodiments, input signals 221a, 221b, 223a, 223b can be controlled/generated by processor 104 and/or PAM driver circuit 106 based on the data from data source 108 to generate the second current. According to some embodiments, the first current and the second current have substantially the same value but different directions. In other words, the first value is substantially the same as the second value and the first direction is opposite to the second direction.

The above examples are discussed with respect to the first half of PAM driver circuit 106, which includes inverter circuits 201a and 201b and resistors 205a and 205b. The second half of PAM driver circuit 106, which includes inverter circuits 203a and 203b and resistors 207a and 207b, can be controlled similarly.

As discussed in more detail with respect to FIG. 4A, for the first encoding of PAM driver circuit 106 (e.g., '+0' encoding) to generate the '+0' output level, input signals 221a, 221b, 223a, 223b can be controlled such that a third current can flow through resistors 207a and 207b. The third current has a third value and a third direction. According to some embodiments, input signals 221a, 221b, 223a, 223b can be controlled/generated by processor 104 and/or PAM driver circuit 106 based on the data from data source 108 to generate the third current.

As discussed in more detail with respect to FIG. 4B, for the second encoding of PAM driver circuit 106 (e.g., '−0' encoding) to generate the '−0' output level, input signals 221a, 221b, 223a, 223b can be controlled such that a fourth current can flow through resistors 207a and 207b. The fourth current has a fourth value and a fourth direction. According to some embodiments, input signals 221a, 221b, 223a, 223b can be controlled/generated by processor 104 and/or PAM driver circuit 106 based on the data from data source 108 to generate the fourth current. According to some embodiments, the third current and the fourth current have substantially the same value but different directions. In other words, the third value is substantially the same as the fourth value and the third direction is opposite to the fourth direction.

For the first encoding of PAM driver circuit 106 (e.g., '+0' encoding), the first current (the current through resistors 205a and 205b) generates a first voltage at output port 211. Similarly, the third current (the current through resistors 207a and 207b) generates a third voltage at output port 213. In this first encoding of PAM driver circuit 106 (e.g., '+0' encoding), the first voltage at output port 211 is substantially the same as the third voltage at output port 213. Therefore, the voltage difference between output ports 211 and 213 is about 0 volts and the output level generated by PAM driver circuit 106 is '+0' output level.

For the second encoding of PAM driver circuit 106 (e.g., '−0' encoding), the second current (the current through resistors 205a and 205b) generates a second voltage at output port 211. Similarly, the fourth current (the current through resistors 207a and 207b) generates a fourth voltage at output port 213. In this second encoding of PAM driver circuit 106 (e.g., '−0' encoding), the second voltage at output port 211 is the substantially the same as the fourth voltage at output port 213. Therefore, the voltage difference between output ports 211 and 213 is about 0 volts and the output level generated by PAM driver circuit 106 is '−0' output level.

According to some embodiments, by changing the direction of the currents flowing through resistors 205a, 205b, 207a, 207b for the '0' output level, electro migration issues can be minimized at resistors 205a, 205b, 207a, 207b. Additionally, the electro migration issues can be minimized at the interconnection between resistor 205a and inverter circuit 201a, at the interconnection between resistor 205b and inverter circuit 201b, at the interconnection between resistor 207a and inverter circuit 203a, and at the interconnection between resistor 207b and inverter circuit 203b.

In non-limiting examples, resistors 205a, 205b, 207a, 207b can have a resistance of about 50 ohms to about 150 ohms. In non-limiting examples, resistors 205a, 205b, 207a, 207b can have a resistance of about 75 ohms to about 125 ohms. In non-limiting examples, resistors 205a, 205b, 207a, 207b can have a resistance of about 90 ohms to about 110 ohms. In non-limiting examples, resistors 205a, 205b, 207a, 207b can have a resistance of about 100 ohms. In non-limiting examples, resistors 205a, 205b, 207a, 207b can have the same or substantially the same resistance. In non-limiting examples, resistors 205a, 205b, 207a, 207b can have different resistances. However, the embodiments of this disclosure are not limited to these examples and resistors 205a, 205b, 207a, 207b can have other values.

Although FIG. 2 and PAM driver circuit 106 are discussed above with respect to PAM-3 modulation, similar circuits and controls can be used for other PAM signaling schemes. For example, similar circuits and controls can be used for PAM signaling schemes with an odd number of output levels, where the '0' output level can be generated using two different encodings (e.g., '+0' encoding and '−0' encoding) as discussed above.

Figure 3:
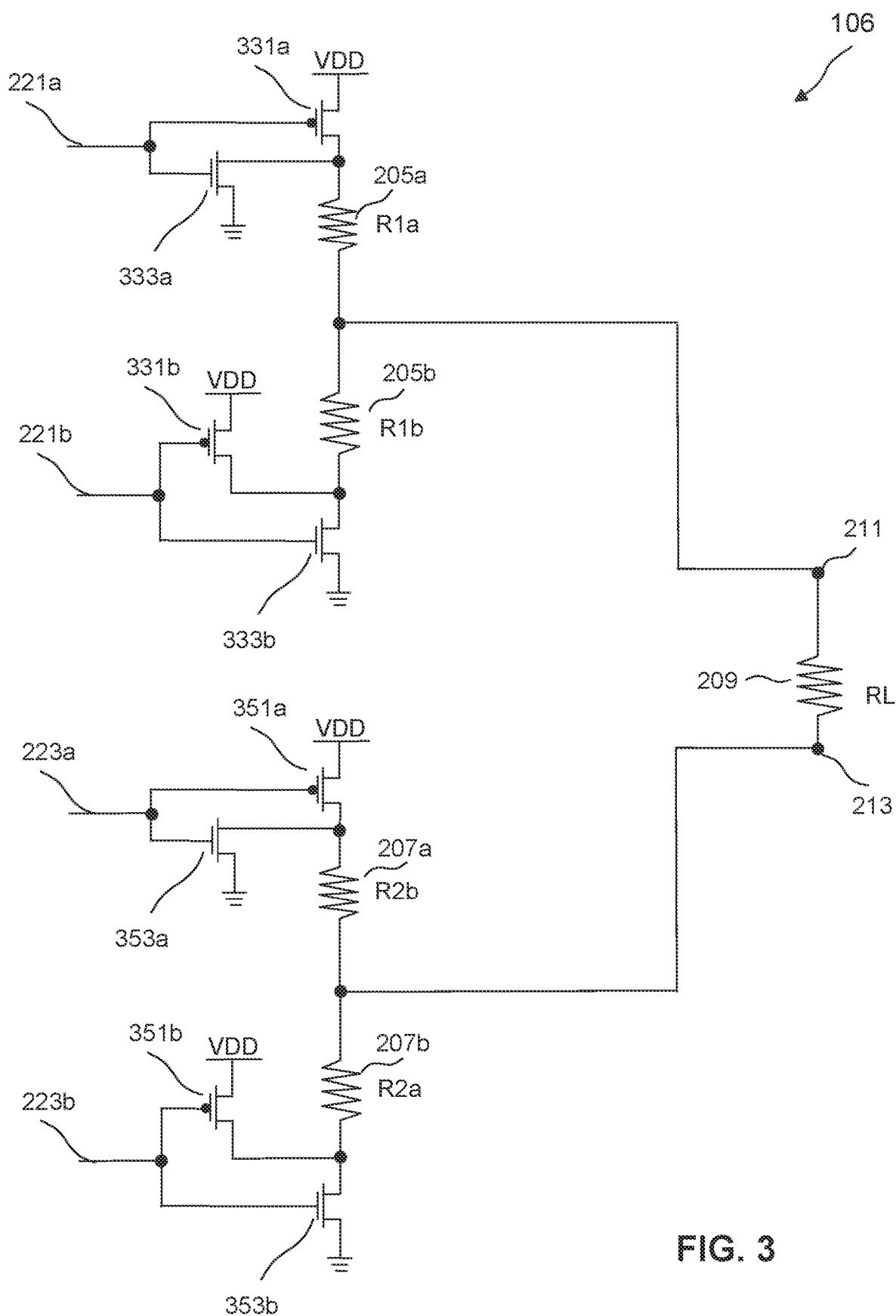
FIG. 3 illustrates a more detailed illustration of the PAM driver circuit, according to some embodiments.

FIG. 3 illustrates a more detailed illustration of PAM driver circuit 106, according to some embodiments. Similar or the same elements in FIG. 3 as the elements in FIGS. 1 and 2 are illustrated with the same numerals and are not discussed in more detail with respect to FIG. 3 for brevity.

FIG. 3 illustrates one exemplary implementation of inverter circuits 201a, 201b, 203a, 203b of FIG. 2. For example, inverter circuit 201a of FIG. 2 can include devices 331a and 333a. Inverter circuit 201b of FIG. 2 can include devices 331b and 333b. Inverter circuit 203a of FIG. 2 can include devices 351a and 353a. Inverter circuit 203b of FIG. 2 can include devices 351b and 353b. Although some exemplary devices of inverter circuits 201a, 201b, 203a, 203b are provided, the embodiments of this disclosure are not limited to these devices, and inverter circuits 201a, 201b, 203a, 203b can include other components. For example, inverter circuits 201a, 201b, 203a, 203b can additionally include resistors, inductors, coils, T-coils, and the like.

According to some implementations, devices 331a, 333a, 331b, 333b, 351a, 353a, 351b, 353b can be implemented as metal-oxide-semiconductor (MOS) transistors. In some embodiments, MOS transistors can include metal-oxide semiconductor field-effect transistors ("MOSFETs"), fin field-effect transistors ("FinFETs"), gate-all-around field-effect transistors ("GAAFETs"), and the like.

In some embodiments, a MOS transistor can have three terminals denoted as "source," "gate," and "drain." In response to an application of a voltage to the gate terminal, the MOS transistor alters the conductivity between the drain and source terminals, thereby changing the flow of current between the two terminals. The voltage applied to the gate terminal needs to exceed a particular value (referred to as a "threshold voltage") to allow current to flow between the drain and source terminals. The current between the drain and source terminals generally increases in response to an increase in the voltage level applied to the gate. Depending on a type of majority carrier (e.g., n-type or p-type) that conducts current between the source and drain terminals, the polarity of voltage level applied to the gate terminal may be different relative to the threshold voltage.

In some embodiments, devices 333a, 333b, 353a, 353b can be implemented as n-type MOS transistors, such as n-type MOSFETs, FinFETs, GAAFETs, and any other suitable devices. In some embodiments, devices 331a, 331b, 351a, 351b can be implemented as p-type MOS transistors, such as p-type MOSFETs, FinFETs, GAAFETs, and any other suitable devices.

In some embodiments, device 331a can have a first terminal that is electrically coupled to a voltage power supply also referred to as "VDD." Device 331a can have a second terminal that is electrically coupled to a first terminal of resistor 205a. Device 331a can have a third terminal configured to receive input 221a. Similarly, device 333a can have a first terminal electrically coupled to the second terminal of device 331a and the first terminal of resistor 205a. Device 333a can have second terminal that is coupled to a ground level (e.g., 0 V), also referred to as "VSS." Device 333a can have a third terminal that is electrically coupled to the third terminal of device 331a and can receive input 221a.

In some examples, VDD can be about 0.5 V to about 1.5 V. For example, VDD can be about 0.75 V to about 1.25 V. For example, VDD can be about 0.95 V to about 1.05 V. For example, VDD can be about 1 V.

In some embodiments, device 331b can have a first terminal that is electrically coupled to the voltage power supply. Device 331b can have a second terminal that is electrically coupled to a first terminal of resistor 205b. Device 331b can have a third terminal configured to receive input 221b. Similarly, device 333b can have a first terminal electrically coupled to the second terminal of device 331b and the first terminal of resistor 205b. Device 333b can have a second terminal that is coupled to the ground level (e.g., 0 V). Device 333b can have a third terminal that is electrically coupled to the third terminal of device 331b and can receive input 221b. A second terminal of resistor 205a is electrically coupled to a second terminal of resistor 205b. Output port 211 is electrically coupled to second terminal of resistor 205a and second terminal of resistor 205b.

In some embodiments, device 351a can have a first terminal that is electrically coupled to the voltage power supply. Device 351a can have a second terminal that is electrically coupled to a first terminal of resistor 207a. Device 351a can have a third terminal configured to receive input 224a. Similarly, device 353a can have a first terminal electrically coupled to the second terminal of device 351a and the first terminal of resistor 207a. Device 353a can have a second terminal that is coupled to the ground level. Device 353a can have a third terminal that is electrically coupled to the third terminal of device 351a and can receive input 223a.

In some embodiments, device 351b can have a first terminal that is electrically coupled to the voltage power supply. Device 351b can have a second terminal that is electrically coupled to a first terminal of resistor 207b. Device 351b can have a third terminal configured to receive input 223b. Similarly, device 353b can have a first terminal electrically coupled to the second terminal of device 351b and the first terminal of resistor 207b. Device 353b can have a second terminal that is coupled to the ground level (e.g., 0 V). Device 353b can have a third terminal that is electrically coupled to the third terminal of device 351b and can receive input 223b. A second terminal of resistor 207a is electrically coupled to a second terminal of resistor 207b. Output port 213 is electrically coupled to the second terminal of resistor 207a and second terminal of resistor 207b.

Although FIG. 3 and PAM driver circuit 106 are discussed above with respect to PAM-3 modulation, similar circuits and controls can be used for other PAM signaling schemes. For example, similar circuits and controls can be used for PAM signaling schemes with an odd number of output levels, where the '0' output level can be generated using two different encodings (e.g., '+0' encoding and '−0' encoding) as discussed above.

FIG. 4A illustrates the PAM driver circuit operating for the '+0' encoding, according to some embodiments. FIG. 4A illustrates a more detailed operation of PAM driver circuit 106 for the '+0' encoding, according to some embodiments. Similar or the same elements in FIG. 4A as the elements in FIGS. 1-3 are illustrated with the same numerals and are not discussed in more detail with respect to FIG. 4A for brevity.

According to some embodiments, input signals 221a, 221b, 223a, 223b are generated to control PAM driver circuit 106 to generate '+0' output level. As discussed above, input signals 221a, 221b, 223a, 223b are generated by processor 104 and/or PAM driver circuit 106 based on the data from data source 108. For example, the data from data source 108 is to be modulated to '0' output level. Based on the data, processor 104 and/or PAM driver circuit 106 generate input signals 221a, 221b, 223a, 223b to generate '+0' output level.

In a non-limiting example, input signal 221a can have a first value (e.g., '0'), input signal 221b can have a second value (e.g., '1'), input signal 223a can have the first value (e.g., '0'), and input signal 223b can have the second value (e.g., '1'). According to some implementations, input control 221a and 221b can be generated from the same input but one is inverted compared to the other. According to some implementations, input control 223a and 223b can be generated from the same input but one is inverted compared to the other.

Given these values of input signals 221a, 221b, 223a, 223b, devices 333a, 331b, 353a, 351b of FIG. 3 are off. Given these values of input signals 221a, 221b, 223a, 223b, devices 331a, 333b, 351a, 353b of FIG. 3 and FIG. 4A are on.

According to some embodiments, the sum of the resistance of device 331a and the resistance of resistor 205a is equal to the sum of the resistance of device 333b and the resistance of resistor 205b. Therefore, the voltage at output port 211 is about VDD/2. Similarly, the sum of the resistance of device 351a and the resistance of resistor 207a is equal to the sum of the resistance of device 353b and the resistance of resistor 207b. Therefore, the voltage at output port 213 is about VDD/2. Therefore, the voltage difference at the output of PAM driver circuit is about 0 V and the '+0' output level is generated.

In these embodiments, current 401 flows through resistors 205a and 205b from VDD to the ground level. The value of current 401 can be about $$I_1 = \frac{VDD}{R1a + R1b},$$

where R1a is me resistance of resistor 205a and R1b is the resistance of resistor 205b. In this example, the resistances of devices 331a and 333b are ignored.

Similarly, current 403 flows through resistors 207a and 207b from VDD to the ground level. The value of current 403 can be about where $$I_2 = \frac{VDD}{R2a + R2b},$$

where R2a is the resistance of resistor 207b and R2b is the resistance of resistor 207a. In this example, the resistances of devices 351a and 353b are ignored.

FIG. 4B illustrates the PAM driver circuit operating for the '−0' encoding, according to some embodiments. FIG. 4B illustrates a more detailed operation of PAM driver circuit 106 for the '−0' encoding, according to some embodiments. Similar or the same elements in FIG. 4B as the elements in FIGS. 1-3 are illustrated with the same numerals and are not discussed in more detail with respect to FIG. 4B for brevity.

According to some embodiments, input signals 221a, 221b, 223a, 223b are generated to control PAM driver circuit 106 to generate '−0' output level. As discussed above, input signals 221a, 221b, 223a, 223b are generated by processor 104 and/or PAM driver circuit 106 based on the data from data source 108. For example, the data from data source 108 is to be modulated to '0' output level. Based on the data, processor 104 and/or PAM driver circuit 106 generate input signals 221a, 221b, 223a, 223b to generate '−0' output level.

In a non-limiting example, input signal 221a can have the second value (e.g., '1'), input signal 221b can have the first value (e.g., '0'), input signal 223a can have the second value (e.g., '1'), and input signal 223b can have the first value (e.g., '0'). According to some implementations, input control 221a and 221b can be generated from the same input but one is inverted compared to the other. According to some implementations, input control 223a and 223b can be generated from the same input but one is inverted compared to the other. In these examples, input signals 221a, 221b, 223a, 223b have the opposite values compared to their corresponding values for '+0' encoding of FIG. 4A.

Given these values of input signals 221a, 221b, 223a, 223b, devices 331a, 333b, 351a, 353b of FIG. 3 are off. Given these values of input signals 221a, 221b, 223a, 223b, devices 333a, 331b, 353a, 351b of FIG. 3 and FIG. 4B are on.

According to some embodiments, the sum of the resistance of device 333a and the resistance of resistor 205a is equal to the sum of the resistance of device 331b and the resistance of resistor 205b. Therefore, the voltage at output port 211 is about VDD/2. Similarly, the sum of the resistance of device 353a and the resistance of resistor 207a is equal to the sum of the resistance of device 351b and the resistance of resistor 207b. Therefore, the voltage at output port 213 is about VDD/2. Therefore, the voltage difference at the output of PAM driver circuit is about 0 V and the '+0' output level is generated.

In these embodiments, current 411 flows through resistors 205b and 205a from VDD to the ground level. The value of current 411 can be about $$I_3 = \frac{VDD}{R1a + R1b},$$

where R1a is the resistance of resistor 205a and R1b is the resistance of resistor 205b. In this example, the resistances of devices 331b and 333a are ignored.

Similarly, current 413 flows through resistors 207b and 207a from VDD to the ground level. The value of current 413 can be about $$I_4 = \frac{VDD}{R2a + R2b},$$

where R2a is the resistance of resistor 207b and R2b is the resistance of resistor 207a. In this example, the resistances of devices 351b and 353a are ignored.

As illustrated in FIGS. 4A and 4B, the direction of current 411 of FIG. 4B is the opposite of the direction of current 401 of FIG. 4A. But both currents 401 and 411 have the same or substantially the same value. Therefore, although both circuits of FIGS. 4A and 4B generate '0' output levels (e.g., FIG. 4A generates '+0' output level and FIG. 4B generates '−0' output level), but the direction of the currents in resistors 205a and 205b is opposite to one another. Accordingly, by controlling input signals 221a, 221b, 223a, 223b, PAM driver circuit 106 can generate the same '0' output level but reverse the currents in resistors 205a and 205b and therefore reduce the effects of electro-migration at these resistors.

Similarly, as illustrated in FIGS. 4A and 4B, the direction of current 413 of FIG. 4B is the opposite of the direction of current 403 of FIG. 4A. But both currents 403 and 413 have the same or substantially the same value. Therefore, although both circuits of FIGS. 4A and 4B generate '0' output levels (e.g., FIG. 4A generates '+0' output level and FIG. 4B generates '−0' output level), but the direction of the currents in resistors 207a and 207b is opposite to one another. Accordingly, by controlling input signals 221a, 221b, 223a, 223b, PAM driver circuit 106 can generate the same '0' output level but reverse the currents in resistors 207a and 207b and therefore reduce the effects of electro-migration at these resistors.

Figure 4C:
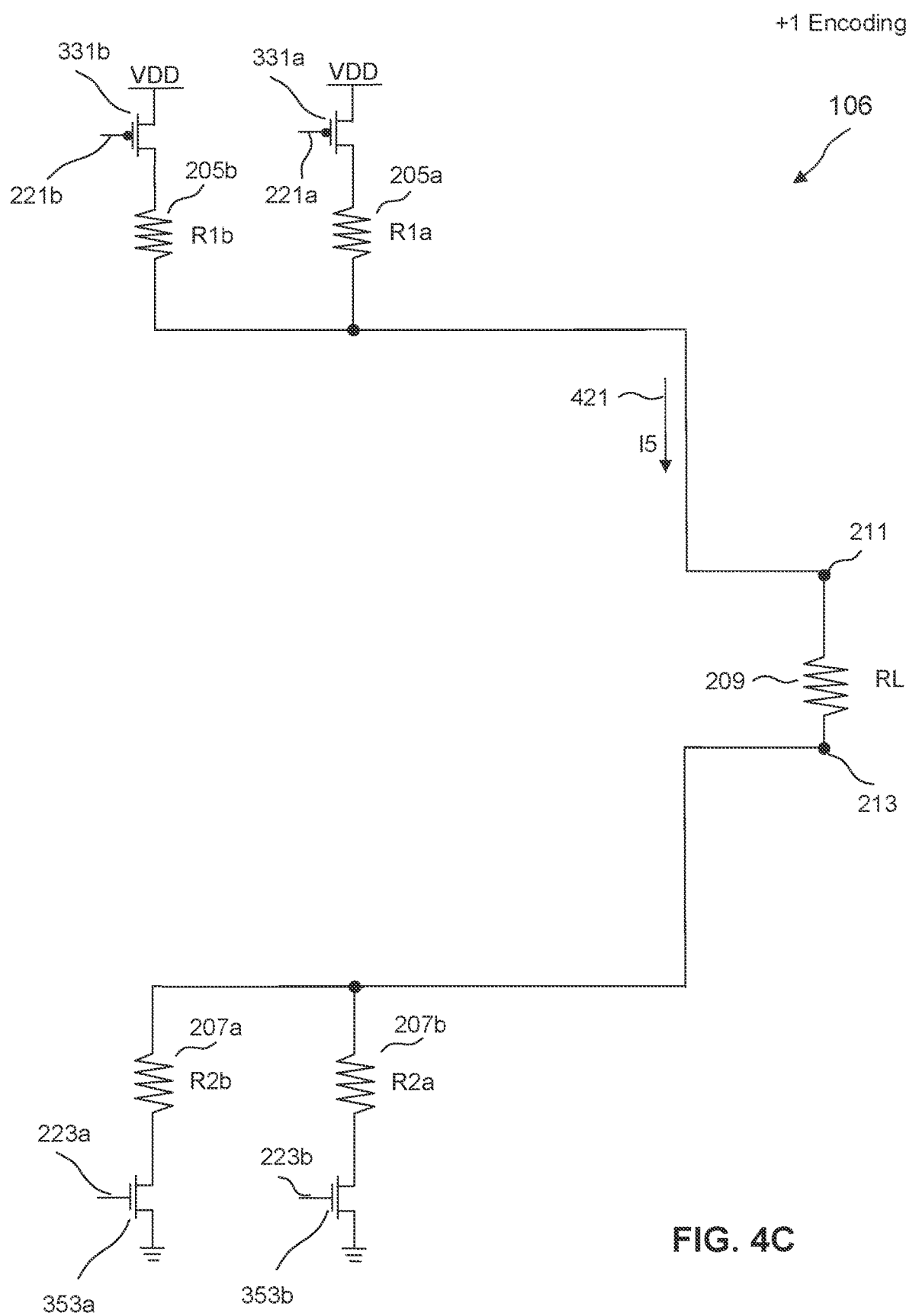
FIG. 4C illustrates the PAM driver circuit operating for the '+1' encoding, according to some embodiments.

FIG. 4C illustrates the PAM driver circuit operating for the '+1' encoding, according to some embodiments. FIG. 4C illustrates a more detailed operation of PAM driver circuit 106 for the '+1' encoding, according to some embodiments. Similar or the same elements in FIG. 4C as the elements in FIGS. 1-3 are illustrated with the same numerals and are not discussed in more detail with respect to FIG. 4C for brevity.

According to some embodiments, input signals 221a, 221b, 223a, 223b are generated to control PAM driver circuit 106 to generate '+1' output level. As discussed above, input signals 221a, 221b, 223a, 223b are generated by processor 104 and/or PAM driver circuit 106 based on the data from data source 108. For example, the data from data source 108 is to be modulated to '+1' output level. Based on the data, processor 104 and/or PAM driver circuit 106 generate input signals 221a, 221b, 223a, 223b to generate '+1' output level.

In a non-limiting example, input signal 221a can have the first value (e.g., '0'), input signal 221b can have the first value (e.g., '0'), input signal 223a can have the second value (e.g., '1'), and input signal 223b can have the second value (e.g., '1'). According to some implementations, input control 221a and 221b can be generated from the same input. According to some implementations, input control 223a and 223b can be generated from the same input.

Given these values of input signals 221a, 221b, 223a, 223b, devices 333a, 333b, 351a, 351b of FIG. 3 are off. Given these values of input signals 221a, 221b, 223a, 223b, devices 331a, 331b, 353a, 353b of FIG. 3 and FIG. 4C are on.

In these embodiments, current 421 flows through resistors 205a, 205b, through load 209, and through resistors 207a, 207b from VDD to the ground level. The value of current 421 can be about $$I_5 = \frac{VDD}{\left(\dfrac{1}{\dfrac{1}{R1a} + \dfrac{1}{R1b}}\right) + \left(\dfrac{1}{\dfrac{1}{R2a} + \dfrac{1}{R2b}}\right) + RL},$$

where R1a is the resistance of resistor 205a, R1b is the resistance of resistor 205b, R2a is the resistance of resistor 207b, and R2b is the resistance of resistor 207a. In this example, the resistances of devices 331a, 331b, 353a, 353a are ignored. Current 421 at load 209 generates the '+1' output level as, for example, the positive voltage difference between the voltage at output port 211 minus the voltage at output port 213.

Figure 4D:
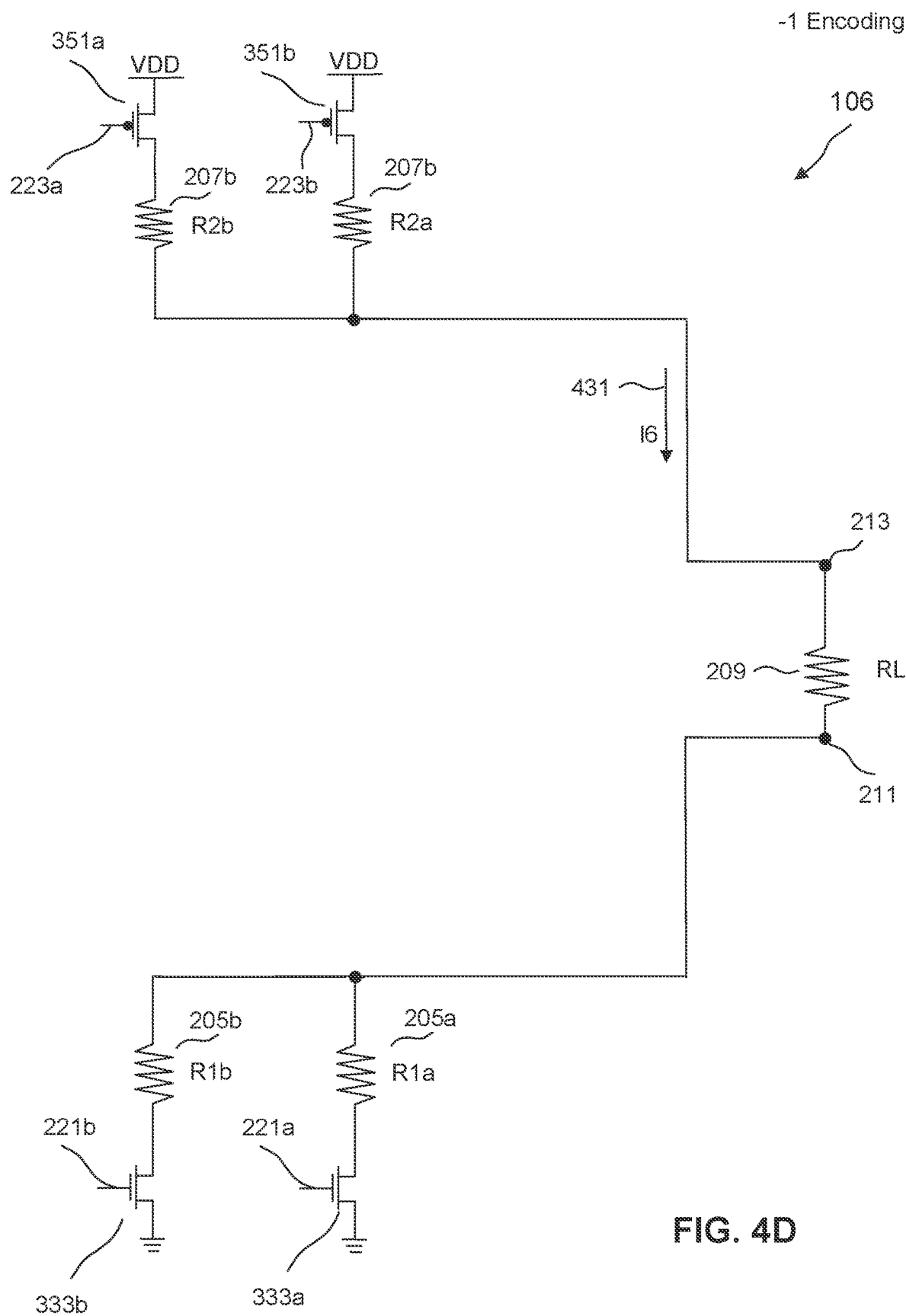
FIG. 4D illustrates the PAM driver circuit operating for the '−1' encoding, according to some embodiments.

FIG. 4D illustrates the PAM driver circuit operating for the '−1' encoding, according to some embodiments. FIG. 4D illustrates a more detailed operation of PAM driver circuit 106 for the '−1' encoding, according to some embodiments. Similar or the same elements in FIG. 4D as the elements in FIGS. 1-3 are illustrated with the same numerals and are not discussed in more detail with respect to FIG. 4D for brevity.

According to some embodiments, input signals 221a, 221b, 223a, 223b are generated to control PAM driver circuit 106 to generate '−1' output level. As discussed above, input signals 221a, 221b, 223a, 223b are generated by processor 104 and/or PAM driver circuit 106 based on the data from data source 108. For example, the data from data source 108 is to be modulated to '−1' output level. Based on the data, processor 104 and/or PAM driver circuit 106 generate input signals 221a, 221b, 223a, 223b to generate '−1' output level.

In a non-limiting example, input signal 221a can have the second value (e.g., '1'), input signal 221b can have the second value (e.g., '1'), input signal 223a can have the first value (e.g., '0'), and input signal 223b can have the first value (e.g., '0'). According to some implementations, input control 221a and 221b can be generated from the same input. According to some implementations, input control 223a and 223b can be generated from the same input.

Given these values of input signals 221a, 221b, 223a, 223b, devices 331a, 331b, 353a, 353b of FIG. 3 are off. Given these values of input signals 221a, 221b, 223a, 223b, devices 333a, 333b, 351a, 351b of FIG. 3 and FIG. 4C are on.

In these embodiments, current 431 flows through resistors 207a, 207b, through load 209, and through resistors 205a, 205b from VDD to the ground level. The value of current 431 can be about $$I_6 = \frac{VDD}{\left(\dfrac{1}{\dfrac{1}{R1a}+\dfrac{1}{R1b}}\right)+\left(\dfrac{1}{\dfrac{1}{R2a}+\dfrac{1}{R2b}}\right)+RL},$$

where R1a is the resistance of resistor 205a, R1b is the resistance of resistor 205b, R2a is the resistance of resistor 207b, and R2b is the resistance of resistor 207a. In this example, the resistances of devices 331a, 331b, 353a, 353a are ignored. Current 431 at load 209 generates the '−1' output level as, for example, the negative voltage difference between the voltage at output port 211 minus the voltage at output port 213.

As illustrated in FIGS. 4C and 4D, the direction of current 431 of FIG. 4D is the opposite of the direction of current 421 of FIG. 4C. But both currents 421 and 431 have the same or substantially the same value. Therefore, the '+1' output level and the '−1' output level generate currents with the same (or substantially the same value) but with opposite directions. By reversing the direction of the currents in resistors 205a, 205b, 207a, 207b, the effects of electro-migration at these resistors is reduced when '+1' output level and '−1' output level are used.

Although FIGS. 4A-4D and PAM driver circuit 106 are discussed above with respect to PAM-3 modulation, similar circuits and controls can be used for other PAM signaling schemes. For example, similar circuits and controls can be used for PAM signaling schemes with an odd number of output levels, where the '0' output level can be generated using two different encodings (e.g., '+0' encoding and '−0' encoding) as discussed above.

Figure 5:
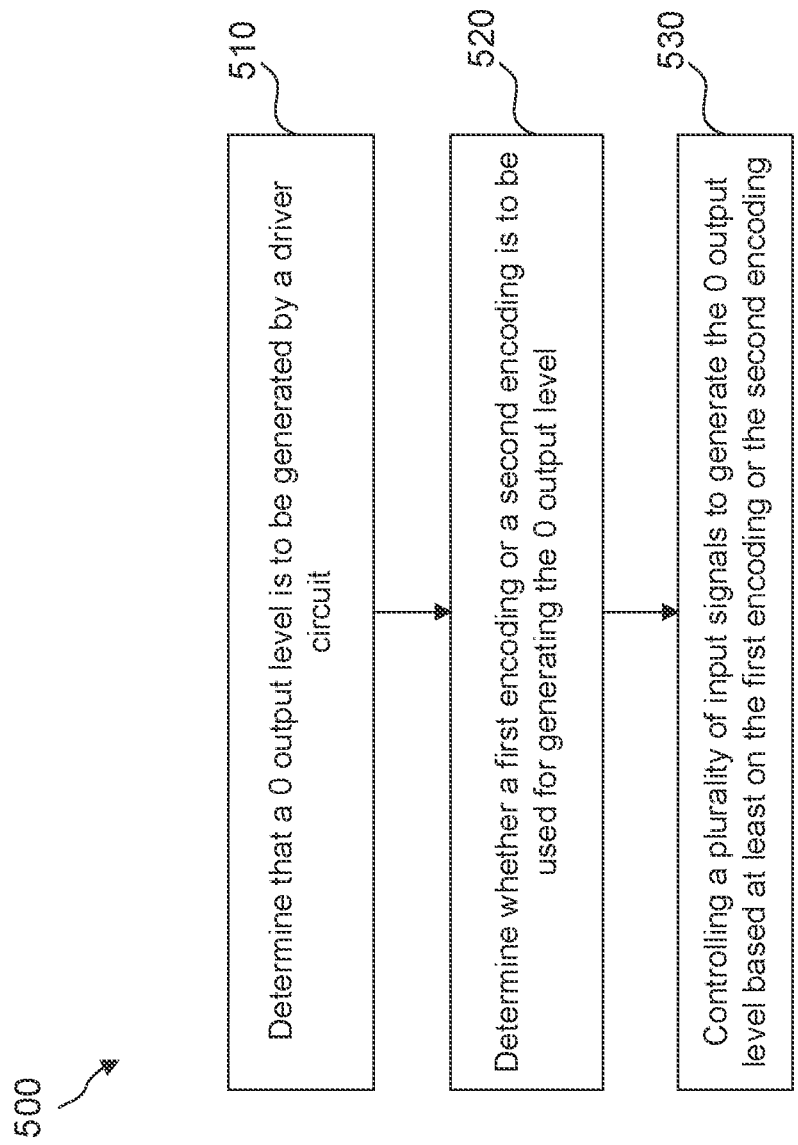
FIG. 5 illustrates a method for operating a PAM driver circuit, according to some embodiments.

FIG. 5 illustrates a method 500 for operating a PAM driver circuit, according to some embodiments. For illustrative purposes, the operations illustrated in method 500 will be described with reference to the example PAM driver circuit 106 in FIGS. 1-3 and 4A-4D. Additional operations may be performed between various operations of method 500 and may be omitted merely for clarity and ease of description. Additional operations can be provided before, during, and/or after method 500; one or more of these additional operations are briefly described herein. Moreover, not all operations may be needed to perform the disclosure provided herein. Additionally, some of the operations may be performed simultaneously or in a different order than shown in FIG. 5. In some embodiments, one or more other operations may be performed in addition to or in place of the presently described operations.

At 510, it is determined that a '0' output level is to be generated by a driver circuit. For example, processor 104 and/or PAM driver circuit 106 determines that PAM driver circuit 106 is to generate a '0' output level. According to some embodiments, processor 104 and/or PAM driver circuit 106 determines that PAM driver circuit 106 is to generate the '0' output level based on data received from a data source (e.g., data source 108 of FIG. 1). Data source 108 can belong to and/or be located at the higher levels (e.g., higher levels in the OSI model) compared to the PAM driver circuit. According to some embodiments, processor 104 and/or PAM driver circuit 106 determines that PAM driver circuit 106 can use at least the received data to determine that the '0' output level is to be generated.

At 520, it is determined whether a first encoding or a second encoding is to be used for generating the '0' output level. For example, processor 104 and/or PAM driver circuit 106 determines the first encoding (e.g., '+0' encoding) or the second encoding (e.g., '−0' encoding) is to be used for generating the '0' output level.

According to some embodiments, processor 104 and/or PAM driver circuit 106 are configured to use different algorithms to determine when and how to change the encodings (e.g., the first encoding to the second encoding and vice versa) for the '0' output level. In some implementations, processor 104 and/or PAM driver circuit 106 are configured to change the encodings for the '0' output level such that an average number of '+0' encodings is equal to (or is substantially equal to) '−0' encodings. Additionally, or alternatively, processor 104 and/or PAM driver circuit 106 are configured to change the encodings for the '0' output level to minimize encoding changes such that consecutive '0' output levels can keep the same encoding. For example, a long string of '0' output levels does not result in multiple '+0' encoding and '−0' encoding changes, which may waste power and create noise.

According to some embodiments, determining whether the first encoding or the second encoding is to be used for generating the '0' output level can include changing the encoding to '+0' encoding every time a '+1' output level is encountered and to '−0' encoding when a '−1' output level is encountered. For example, determining whether the first encoding or the second encoding is to be used for generating the '0' output level can include determining whether a previous output level included a '+1' output level or a '−1' output level. In these examples, in response to determining that the previous output level included the '+1' output level, processor 104 and/or PAM driver circuit 106 can determine that the first encoding (e.g., the '+0' encoding) is to be used for generating the '0' output level. In response to determining that the previous output level included the '−1' output level, processor 104 and/or PAM driver circuit 106 can determine that the second encoding (e.g., the '−0' encoding) is to be used for generating the '0' output level.

According to some embodiments, determining whether the first encoding or the second encoding is to be used for generating the '0' output level can include alternating between '+0' encoding and '−0' encoding every time there is a power state transition. According to some implementations, the power state transition can include transitions between different power states of, for example, processor 104, PAM driver circuit 106, data source 108, and/or transmitter device 102 of FIG. 1. For example, the power state transition can include transition from active state to sleep state or vice versa. However, the embodiments of this disclosure can include other power state transitions. In some implementations, the determining whether the first encoding or the second encoding is to be used for generating the '0' output level can include determining whether a previous '0' output level was generated using the first encoding (e.g., '+0' encoding), determining that a power state transition has occurred, and in response to determining that the power state transition has occurred, determining that the second encoding (e.g., '−0' encoding) is to be used for generating the '0' output level.

According to some embodiments, determining whether the first encoding or the second encoding is to be used for generating the '0' output level can include time or number of symbols/words alternating between the '+0' encoding and the '−0' encoding periodically. For example, determining whether the first encoding or the second encoding is to be used for generating the '0' output level can include periodically switching between the first encoding (e.g., '+0' encoding) and the second encoding (e.g., '−0' encoding). The periodicity of the switching can depend at least on one of a time period or a number of symbols/words. For example, for every T seconds (e.g., a predetermined period), the encoding for '0' output level can change between the first and second encodings. According to some embodiments, the number of symbols/words include the number of symbols/words in the data provided by data source 108 that is used by PAM driver circuit 106 to generate the output signals sent to receiver device 110. For example, for a first N symbols/words, the first encoding is used. For the second N symbols/words, the second encoding is used. For the third N symbols/words, the first encoding is used; and so on. In some non-limiting examples, N can be 10, 20, 40, 80, 160, or the like, or N can be a binary number like 16, 32, 64, 128, 256, or the like. However, the embodiments of this disclosure are not limited to these examples.

According to some embodiments, determining whether the first encoding or the second encoding is to be used for generating the '0' output level can include examining a first symbol in a multi-symbol word. In these example, if that symbol generates the '+1' output level (e.g., (1,1)), then processor 104 and/or PAM circuit driver 106 use the '+0' encoding (e.g., (1,0) symbol encoding) for the entire word. However, if that symbol generates the '−1' output level (e.g., (0,0)), then processor 104 and/or PAM circuit driver 106 use the '−0' encoding (e.g., (0,1) symbol encoding). If that symbol generates the '0' output level, then processor 104 and/or PAM circuit driver 106 keep the previous encoding. For example, determining whether the first encoding or the second encoding is to be used for generating the '0' output level includes examining a first symbol in a multi-symbol word input to the driver circuit. The multi-symbol word can include the multi-symbol word in the data provided by data source 108 that is used by PAM driver circuit 106 to generate the output signals sent to receiver device 110. In response to the first symbol generating the '+1' output level, method 500 can include determining to use the first encoding (e.g., '+0' encoding). In response to the first symbol generating the '−1' output level, method 500 can include determining to use the second encoding (e.g., '−0' encoding). In response to the first symbol generating the '0' output level, method 500 can further include determining to use a previous encoding associated with a previous '0' output level associated with a previous multi-symbol word.

At 530, a plurality of input signals are controlled to generate the '0' output level based at least on the first encoding or the second encoding. For example, processor 104 and/or PAM driver circuit 106 can generate and/or determine input signals to control PAM driver circuit 106 to generate the '0' output level based on the encoding determined at 520. As discussed above in detail with respect to FIGS. 1-3 and 4A-4D, processor 104 and/or PAM driver circuit 106 can generate and/or determine the input signals to one or more inverter circuits to control PAM driver circuit 106 to generate the '0' output level based on the encoding determined at 520.

According to some embodiments, for PAM signaling with an odd number of output levels, swapping the encoding (e.g., between the '+0' encoding and the '−0' encoding) can be logically equivalent to transposing or swapping the most significant bit (MSB) and the least significant bit (LSB) bits in a symbol or can be logically equivalent to swapping the entire MSB and LSB words in a multi-symbol word. However, the swapping the encoding may be implemented with any form of combinational logic that produces the correct results.

Figure 6:
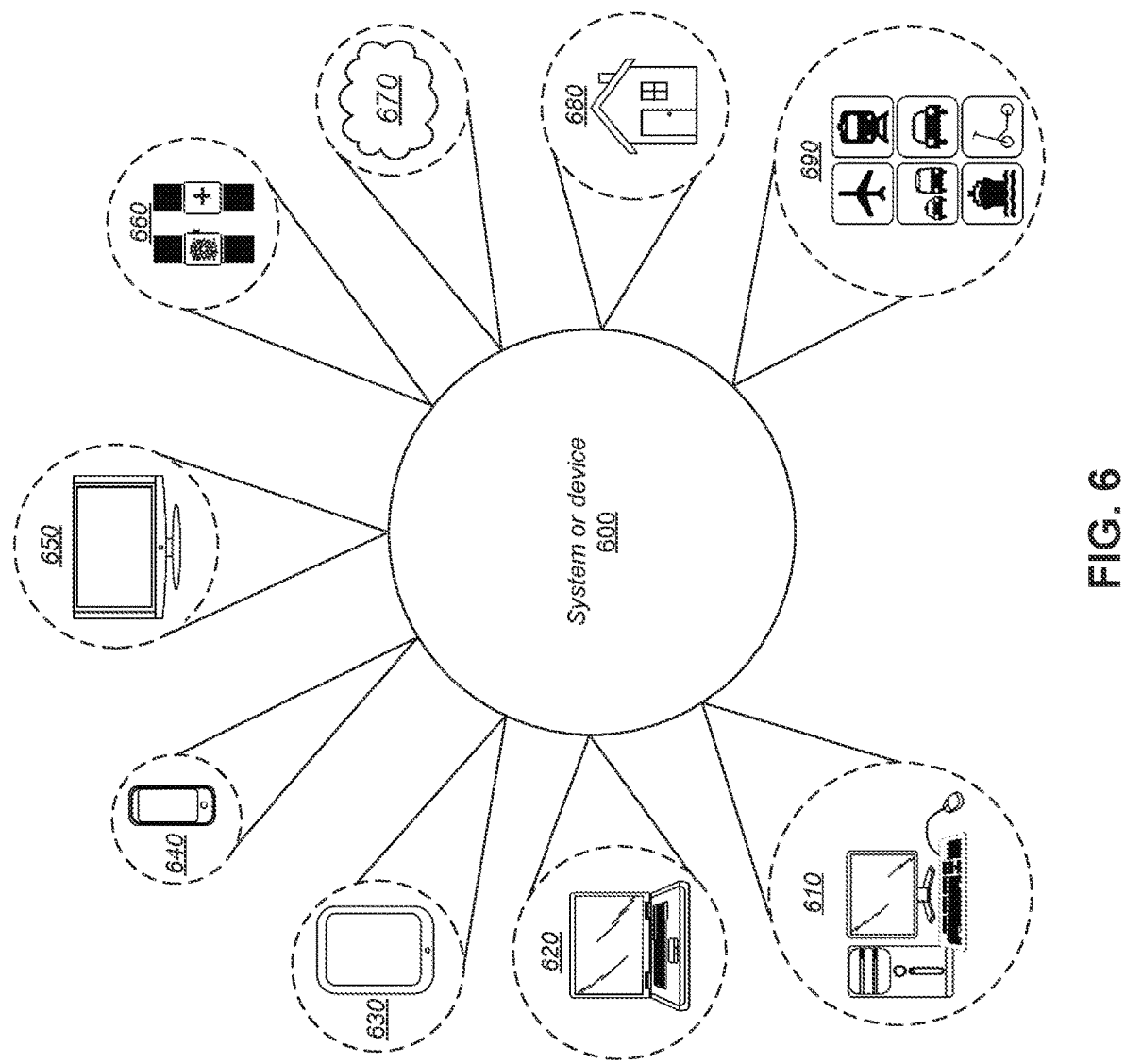
FIG. 6 illustrates various exemplary systems or devices that include embodiments of the disclosed PAM driver circuit.

FIG. 6 illustrates exemplary systems of devices that include embodiments of the PAM driver circuits as described herein. System or device 600, which can incorporate or otherwise utilize one or more of the techniques described herein, can be utilized in a wide range of areas. For example, system or device 600 can be utilized as part of the hardware of systems such as a desktop computer 610, a laptop computer 620, a tablet computer 630, a cellular or mobile phone 640, or a television 650 (or a set-top box coupled to a television).

Similarly, the disclosed embodiments can be utilized in a wearable device 660, such as a smartwatch or a health-monitoring device. Smartwatches can implement a variety of different functions—for example, access to email, cellular service, calendar, health monitoring, etc. A wearable device can also be designed solely to perform health-monitoring functions, such as monitoring a user's vital signs, performing epidemiological functions such as contact tracing, providing communication to an emergency medical service, etc. Other types of devices are also contemplated, including devices worn on the neck, devices implantable in the human body, glasses or a helmet designed to provide computer-generated reality experiences such as those based on augmented and/or virtual reality, etc.

System or device 600 can also be used in various other contexts. For example, system or device 600 can be utilized in the context of a server computer system, such as a dedicated server or on shared hardware that implements a cloud-based service 670. Still further, system or device 600 can be implemented in a wide range of specialized devices, such as home electronic devices 680 that includes refrigerators, thermostats, security cameras, etc. The interconnection of such devices is often referred to as the "Internet of Things" (IoT). Elements can also be implemented in various modes of transportation. For example, system or device 600 can be employed in the control systems, guidance systems, entertainment systems, etc. of various types of vehicles 690.

The applications illustrated in FIG. 6 are merely exemplary and are not intended to limit the potential future applications of disclosed systems or devices. Other example applications include, without limitation, portable gaming devices, music players, data storage devices, unmanned aerial vehicles, etc.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A driver circuit, comprising:
a first circuit, comprising:
a first inverter circuit having a first input terminal and a first output terminal;
a first impedance element electrically coupled to the first output terminal;
a second inverter circuit having a second input terminal and a second output terminal; and
a second impedance element electrically coupled to the second output terminal and electrically coupled to the first impedance element at a first connection point; and
a second circuit, comprising:
a third inverter circuit having a third input terminal and a third output terminal;
a third impedance element electrically coupled to the third output terminal;
a fourth inverter circuit having a fourth input terminal and a fourth output terminal; and
a fourth impedance element electrically coupled to the fourth output terminal and electrically coupled to the third impedance element at a second connection point,
wherein a first input signal to the first input terminal, a second input signal to the second input terminal, a third input signal to the third input terminal, and a fourth input signal to the fourth input terminal are selected such that the first connection point has substantially a same voltage as the second connection point for encoding a value using the driver circuit.

2. The driver circuit of claim 1, wherein each of the first, second, third, and fourth inverter circuits comprises an n-type metal-oxide-semiconductor (MOS) transistor and a p-type MOS transistor.

3. The driver circuit of claim 1, wherein:
for a first encoding, the first signal and second signal are selected such that a first current flows through the first and second impedance elements, the first current having a first value and a first direction,
for a second encoding, the first signal and second signal are selected such that a second current flows through the first and second impedance elements, the second current having a second value and a second direction,
the first value is substantially the same as the second value, and
the first direction is opposite to the second direction.

4. The driver circuit of claim 3, wherein for the first encoding, the first signal and second signal are selected such that:
a first n-type transistor of the first inverter circuit is off and a first p-type transistor of the first inverter circuit is on, and
a second n-type transistor of the second inverter circuit is on and a second p-type transistor of the second inverter circuit is off.

5. The driver circuit of claim 4, wherein for the second encoding, the first signal and second signal are selected such that:
the first n-type transistor of the first inverter circuit is on and the first p-type transistor of the first inverter circuit is off, and
the second n-type transistor of the second inverter circuit is off and the second p-type transistor of the second inverter circuit is on.

6. The driver circuit of claim 5, wherein for the first encoding, the first signal and second signal are selected such that:
a third n-type transistor of the third inverter circuit is off and a third p-type transistor of the third inverter circuit is on, and
a fourth n-type transistor of the fourth inverter circuit is on and a fourth p-type transistor of the fourth inverter circuit is off.

7. The driver circuit of claim 6, wherein for the second encoding, the first signal and second signal are selected such that:
the third n-type transistor of the third inverter circuit is on and the third p-type transistor of the third inverter circuit is off, and
the fourth n-type transistor of the fourth inverter circuit is off and the fourth p-type transistor of the fourth inverter circuit is on.

8. The driver circuit of claim 1, further comprising:
a load having a first terminal and a second terminal,
wherein the first terminal is electrically coupled to the first and second impedance elements, and
wherein the second terminal is electrically coupled to the third and fourth impedance elements.

9. The driver circuit of claim 8, wherein:
for a first encoding, the first signal and second signal are selected such that a first current flows through the load, the first current having a first value and a first direction,
for a second encoding, the first signal and second signal are selected such that a second current flows through the load, the second current having a second value and a second direction,
the first value is substantially the same as the second value, and
the first direction is opposite to the second direction.

10. A device, comprising:
a first inverter circuit electrically coupled to a first impedance element;
a second inverter circuit electrically coupled to a second impedance element, wherein the second impedance element is electrically coupled to the first impedance element; and
a processor configured to:
control, based on a first encoding, the first inverter circuit and the second inverter circuit such that a first current flows through the first and second impedance elements, the first current having a first value and a first direction; and
control, based on a second encoding, the first inverter circuit and the second inverter circuit such that a second current flows through the first and second impedance elements, the second current having a second value and a second direction,
wherein the first value is substantially the same as the second value and the first direction is opposite to the second direction.

11. The device of claim 10, further comprising:
a third inverter circuit electrically coupled to a third impedance element; and
a fourth inverter circuit electrically coupled to a fourth impedance element, wherein the fourth impedance element is electrically coupled to the third impedance element.

12. The device of claim 11, wherein the processor is further configured to:
control, based on the first encoding, the third inverter circuit and the fourth inverter circuit such that a third current flows through the third and fourth impedance elements, the third current having a third value and a third direction; and
control, based on the second encoding, the third inverter circuit and the fourth inverter circuit such that a fourth current flows through the third and fourth impedance elements, the fourth current having a fourth value and a fourth direction,
wherein the third value is substantially the same as the fourth value and the third direction is opposite to the fourth direction.

13. The device of claim 10, wherein for the first encoding, the processor is configured to:
turn off a first n-type transistor of the first inverter circuit;
turn on a first p-type transistor of the first inverter circuit;
turn on a second n-type transistor of the second inverter circuit; and
turn off a second p-type transistor of the second inverter circuit.

14. The device of claim 13, wherein for the second encoding, the processor is configured to:
turn on the first n-type transistor of the first inverter circuit;
turn off the first p-type transistor of the first inverter circuit;
turn off the second n-type transistor of the second inverter circuit; and
turn on the second p-type transistor of the second inverter circuit.

15. A method, comprising:
determining that a first output level is to be generated by a driver circuit configured to generate an odd number of output levels;
determining whether a first encoding or a second encoding is to be used for generating the first output level, wherein an average current in the driver circuit generated by the first encoding and the second encoding is substantially zero; and
controlling a plurality of input signals to generate the first output level based at least on the first encoding or the second encoding.

16. The method of claim 15, wherein the determining that the first output level is to be generated by the driver circuit comprises:
receiving data from a data source; and
determining, based at least on the received data, that the first output level is to be generated.

17. The method of claim 15, wherein the determining whether the first encoding or the second encoding is to be used for generating the first output level comprises:
determining whether a previous output level included a second output level or a third output level;
in response to determining that the previous output level included the second output level, determining that the first encoding is to be used for generating the first output level; and
in response to determining that the previous output level included the third output level, determining that the second encoding is to be used for generating the first output level.

18. The method of claim 15, wherein the determining whether the first encoding or the second encoding is to be used for generating the first output level comprises:
determining whether a previous first output level was generated using the first encoding;
determining that a power state transition has occurred; and
in response to determining that the power state transition has occurred, determining that the second encoding is to be used for generating the first output level.

19. The method of claim 15, further comprising:
enabling the driver circuit to use the first encoding and the second encoding,
wherein the determining whether the first encoding or the second encoding is to be used for generating the first output level comprises periodically switching between the first encoding and the second encoding, wherein a periodicity of the switching depends at least on one of a time period or a number of symbols or words.

20. The method of claim 15, further comprising:
enabling the driver circuit to use the first encoding and the second encoding, wherein the determining whether the first encoding or the second encoding is to be used for generating the first output level comprises:
examining a first symbol in a multi-symbol word input to the driver circuit;
in response to the first symbol generating a second output level, determining to use the first encoding;
in response to the first symbol generating a third output level, determining to use the second encoding; and
in response to the first symbol generating the first output level, determining to use a previous encoding associated with a previous first output level associated with a previous multi-symbol word.

* * * * *